(12) United States Patent
Wakasugi (10) Patent No.: US 10,069,418 B2
(45) Date of Patent: Sep. 4, 2018

(54) SEMICONDUCTOR DEVICE AND DC-DC CONVERTER

(71) Applicant: KABUSHIKI KAISHA TOSHIBA, Tokyo (JP)

(72) Inventor: Kenichi Wakasugi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/439,791

(22) Filed: Feb. 22, 2017

(65) Prior Publication Data

US 2018/0091050 A1 Mar. 29, 2018

(30) Foreign Application Priority Data

Sep. 23, 2016 (JP) ................. 2016-185558

(51) Int. Cl.
*H02M 3/158* (2006.01)
*H03M 1/08* (2006.01)
*H03K 7/08* (2006.01)
*H03K 7/06* (2006.01)
*H02M 1/00* (2006.01)

(52) U.S. Cl.
CPC .............. *H02M 3/158* (2013.01); *H03K 7/06* (2013.01); *H03K 7/08* (2013.01); *H03M 1/08* (2013.01); *H02M 2001/0009* (2013.01)

(58) Field of Classification Search
CPC ........... H03K 7/06; H03K 7/08; H02M 3/158; H03M 1/08
See application file for complete search history.

(56) References Cited

U.S. PATENT DOCUMENTS

| 7,501,805 B2 * | 3/2009 | Chen ..................... H02M 1/36 323/282 |
| 8,456,143 B2 | 6/2013 | Nakashima |
| 9,337,729 B2 | 5/2016 | Kokatsu |
| 9,401,637 B2 * | 7/2016 | Wei ..................... H02M 3/156 |
| 2007/0057654 A1 * | 3/2007 | Lee .......................... H02M 1/32 323/271 |
| 2010/0283442 A1 * | 11/2010 | Nakashima ......... H02M 3/1588 323/283 |

(Continued)

FOREIGN PATENT DOCUMENTS

| JP | 2009-065753 A | 3/2009 |
| JP | 2010-081749 A | 4/2010 |

(Continued)

*Primary Examiner* — Emily P Pham
(74) *Attorney, Agent, or Firm* — Patterson & Sheridan, LLP (57) ABSTRACT

A semiconductor device includes a modulator, a comparator, a pulse width setting circuit, and a driver. The modulator modulates a reference voltage to generate a reference signal. The comparator generates a comparator signal based on a result of comparing the reference signal and a feedback of an output signal supplied to an output terminal. The pulse width setting circuit generates a pulse modulation signal based on the comparator signal, wherein pulses of the pulse modulation signal have a pulse width that is equal to or greater than a predetermined pulse width. The driver outputs a driving signal that is based on the pulse modulation signal to the output terminal through an inductor.

20 Claims, 5 Drawing Sheets

(56) References Cited

U.S. PATENT DOCUMENTS

| | | | | |
|---|---|---|---|---|
| 2011/0127981 A1* | 6/2011 | Miyamae | ............... | H02M 3/156 |
| | | | | 323/282 |
| 2012/0105031 A1* | 5/2012 | Kumagai | ............... | H02M 3/156 |
| | | | | 323/271 |
| 2015/0256074 A1* | 9/2015 | Biondi | ................... | H02M 1/38 |
| | | | | 323/271 |

FOREIGN PATENT DOCUMENTS

| JP | 4720821 A2 | 4/2011 |
|---|---|---|
| JP | 2015-089167 A | 5/2015 |
| JP | 2015-126617 A | 7/2015 |

* cited by examiner

FIG. 5

SEMICONDUCTOR DEVICE AND DC-DC CONVERTER

CROSS-REFERENCE TO RELATED APPLICATION

This application is based upon and claims the benefit of priority from Japanese Patent Application No. 2016-185558, filed Sep. 23, 2016, the entire contents of which is incorporated herein by reference.

FIELD

Embodiments described herein relate generally to a semiconductor device and a DC-DC converter.

BACKGROUND

Conventionally, there has been a DC-DC converter which is capable of generating a PWM signal having a pulse width depending on an output voltage by modulating a reference voltage into a triangular wave or the like to generate a reference signal, and then comparing the reference signal and a feedback signal, which is based on an output voltage, with each other.

In the DC-DC converter, a driver switching is performed depending on a frequency of the reference signal. As a result, the DC-DC converter will consume more power due to losses created during switching.

DETAILED DESCRIPTION

Embodiments provide a semiconductor device and a DC-DC converter, which generate a pulse signal depending on an output voltage, and in the process suppress the amount of power consumed due to switching losses.

In general, according to one embodiment, a semiconductor device includes a modulator, a comparator, a pulse width setting circuit, and a driver. The modulator modulates a reference voltage to generate a reference signal. The comparator generates a comparator signal based on a result of comparing the reference signal and a feedback of an output signal supplied to an output terminal. The pulse width setting circuit generates a pulse modulation signal based on the comparator signal, wherein pulses of the pulse modulation signal have a pulse width that is equal to or greater than a predetermined pulse width. The driver outputs a driving signal that is based on the pulse modulation signal to the output terminal through an inductor.

(First Embodiment)

Hereinafter, an embodiment will be described with reference to the drawings.

Figure 1:
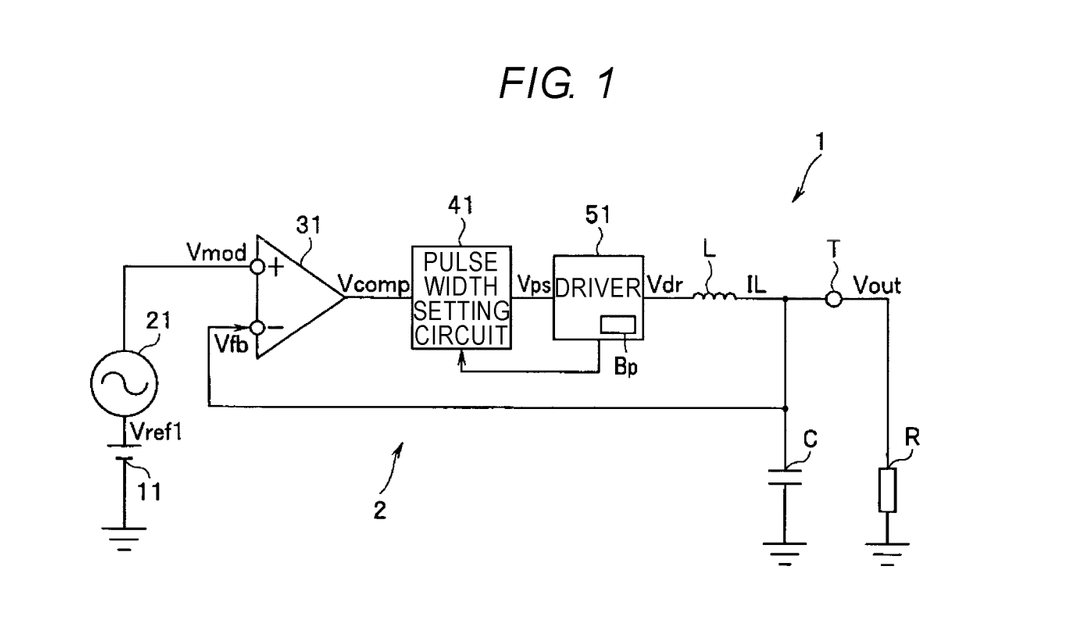
FIG. 1 is a circuit diagram illustrating an example of a DC-DC converter according to a first embodiment.
Figure 2:
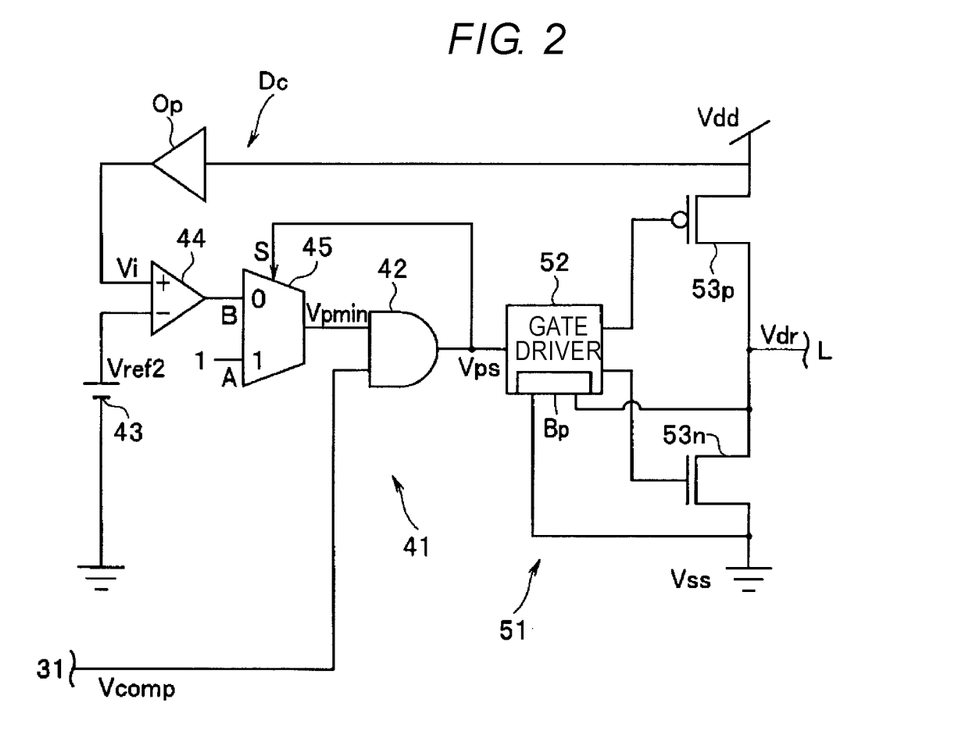
FIG. 2 is a circuit diagram illustrating an example of a pulse width setting circuit and a driver of the DC-DC converter according to the first embodiment.

FIG. 1 is a circuit diagram illustrating an example of a DC-DC converter 1 according to a first embodiment. FIG. 2 is a circuit diagram illustrating an example of a pulse width setting circuit 41 and a driver 51 of the DC-DC converter 1 according to the first embodiment.

The DC-DC converter 1 includes a power supply circuit 11, a modulator 21, a comparator 31, a pulse width setting circuit 41, a driver 51, an inductor L, a capacitor C, and an output terminal T. A semiconductor device 2, which is part of the DC-DC converter 1, includes a power supply circuit 11, the modulator 21, the comparator 31, the pulse width setting circuit 41, and the driver 51. An external load device R is connected between the output terminal T and a fixed potential. The output terminal T outputs an output voltage Vout to the external load device R. The fixed potential is, for example, the ground voltage.

One end of the power supply circuit 11 is connected to the fixed potential, and the other end thereof is connected to the modulator 21. The power supply circuit 11 generates a reference voltage Vref1 and outputs the generated reference voltage Vref1 to the modulator 21.

The modulator 21 modulates the reference voltage Vref1 based on a predetermined clock signal and outputs a reference signal Vmod generated by the modulation to the comparator 31. The reference signal Vmod is a modulation wave such as a triangular wave or a sine wave.

In the comparator 31, a non-inverse input terminal is connected to the modulator 21, an inverse input terminal is connected to the output terminal T, and the output terminal is connected to the pulse width setting circuit 41. The comparator 31 compares the reference signal Vmod and a feedback signal Vfb based on the output voltage Vout with each other and outputs a comparator signal Vcomp generated based on the results of the comparison to the pulse width setting circuit 41. In addition, the feedback signal Vfb may have a divided voltage acquired by dividing the output voltage Vout using a voltage dividing circuit or the like.

The comparator signal Vcomp is at an H level when the feedback signal Vfb is equal to or more than the reference signal Vmod, and at an L level when the feedback signal Vfb is less than the reference signal Vmod. That is, the comparator signal Vcomp includes a negative pulse that has an amplitude that is negative when the feedback signal Vfb is less than the reference signal Vmod.

The pulse width setting circuit 41 generates the pulse modulation signal Vps of which each pulse width is limited to be a predetermined pulse width or more, based on the comparator signal Vcomp, and outputs the pulse modulated signal Vps to the driver 51. The predetermined pulse width of the pulse modulation signal Vps has a minimum pulse width during operation under a light-load, which is described further below. The predetermined pulse width is determined in advance based on, for example, an input/output voltage of the DC-DC converter 1, an inductance value of the inductor L, and a target efficiency, and is set based on a detection result of a current detection circuit Dc (FIG. 2). As illustrated in FIG. 2, the pulse width setting circuit 41 includes an AND circuit 42, a current detection amplifier Op, a power supply circuit 43, a comparator 44, and a multiplexer 45. The current detection circuit Dc includes the current detection amplifier Op, the power supply circuit 43, and the comparator 44 that is configured to detect when an inductor current IL is equal to or more than a predetermined peak current Ipeak (see the dashed IL dotted line of FIG. 4F).

The AND circuit 42 performs an AND operation using the comparator signal Vcomp and an input signal (a minimum pulse width signal Vpmin which is a pulse width signal) received from the multiplexer 45. The AND circuit 42 outputs the pulse modulation signal Vps to a gate driver 52. When the comparator signal Vcomp is at an H level and the minimum pulse width signal Vpmin is at an H level, the pulse modulation signal Vps will be at an H level. When at least one of the comparator signal Vcomp and the minimum pulse width signal Vpmin is at an L level, the pulse modulation signal Vps is at an L level.

The current detection amplifier Op is provided between a source of a FET 53p within the driver 51 and the comparator 44. The current detection amplifier Op outputs a detection signal Vi to the comparator 44. The detection signal Vi is acquired by converting the current which flows on the FET 53p according to a predetermined detection gain Ri.

One end of the power supply circuit 43 is connected to the fixed potential, and the other end thereof is connected to the comparator 44. The power supply circuit 43 generates a reference voltage Vref2 and outputs the generated reference voltage Vref2 to the comparator 44.

The reference voltage Vref2 is preset such that the inductor current IL does not exceed the predetermined peak current Ipeak. The reference voltage Vref2 is represented by Expression (1).

$$Vref2[V] = Ipeak[A] \times Ri[V/A] \qquad (1)$$

In the comparator 44, the non-inverse input terminal is connected to the current detection amplifier Op, the inverse input terminal is connected to the power supply circuit 43, and the output terminal is connected to the multiplexer 45. The comparator 44 compares the detection signal Vi and the reference voltage Vref2 with each other to output a comparison result to the multiplexer 45. An output signal of the comparator 44 is at an H level when the detection signal Vi is equal to or more than the reference voltage Vref2, and is at an L level when the detection signal Vi is less than the reference voltage Vref2.

A control signal S based on the pulse modulation signal Vps is fed back to the multiplexer 45. The multiplexer 45 outputs an input signal into an input terminal A or B, to the AND circuit 42 as the minimum pulse width signal Vpmin according to the control signal S. The minimum pulse width signal Vpmin is a signal (for example, an H level) based on the input signal of the input terminal A when the control signal S is at an H level, and is a signal based on the signal input from the comparator 44 when the control signal S is at an L level.

That is, the minimum pulse width signal Vpmin includes a negative pulse which has a predetermined pulse width. The pulse width setting circuit 41 generates the minimum pulse width signal Vpmin based on the detection result of the current detection circuit Dc, and generates the pulse modulation signal Vps based on the minimum pulse width signal Vpmin.

The driver 51 outputs a driving signal Vdr based on the pulse modulation signal Vps to the inductor L. The driver 51 is a circuit that includes the gate driver 52, the FETs 53p and 53n, and suppresses a reverse flow of a current from the inductor L. The driver 51 drives respective gates of the FET 53p and the FET 53n to generate the driving signal Vdr.

The gate driver 52 drives the gates of the FET 53p and the FET 53n by switching. The gate driver 52 turns ON the FET 53p and turns OFF the FET 53n when the pulse modulation signal Vps is at an L level, and turns OFF the FET 53p and turns ON the FET 53n when the pulse modulation signal Vps is at an H level. The driver 51 includes a reverse flow suppressing circuit Bp. The reverse flow suppressing circuit Bp turns OFF the FET 53n to interrupt the reverse flow of the current when a drain voltage is higher than a source voltage of the FET 53n.

The FET 53p includes a p-type semiconductor. In the FET 53p, a source is connected to a power supply voltage Vdd, and a drain is connected to the inductor L. When the FET 53p is turned ON by the gate driver 52, the FET 53p outputs the power supply voltage Vdd to the inductor L as the driving signal Vdr.

The FET 53n includes an n-type semiconductor. In the FET 53n, the source is connected to a ground voltage Vss, and the drain is connected to the inductor L. When the gate is turned ON by the gate driver 52, the FET 53n outputs the ground voltage Vss to the inductor L as the driving signal Vdr.

The inductor L is provided between the driver 51 and the output terminal T. A capacitor C is provided between the output terminal T and the fixed potential. The inductor L and the capacitor C smooth the driving signal Vdr.

Operation

An example of the operation of the DC-DC converter 1 using a heavy-load will be described below. In the heavy-load operation, an average output current Iout1 for the external load device R is set to be larger than that of the light-load operation.

Figure 3A:
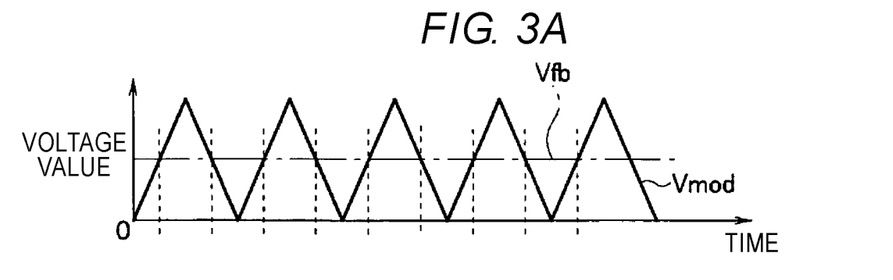
FIG. 3A is a view illustrating exemplary waveforms of a reference signal and a feedback signal of the DC-DC converter according to the first embodiment.
Figure 3B:
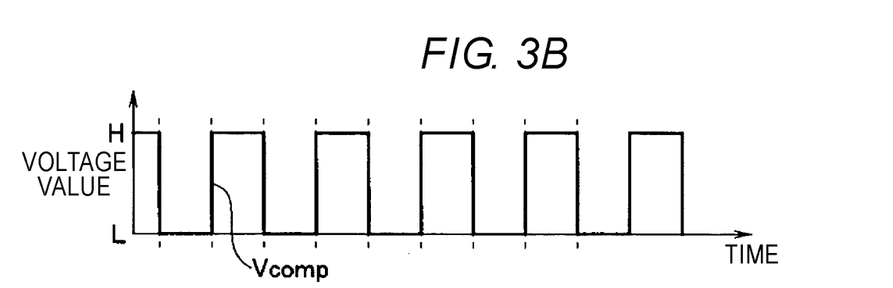
FIG. 3B is a view illustrating an exemplary waveform of a comparator signal of the DC-DC converter according to the first embodiment.
Figure 3C:
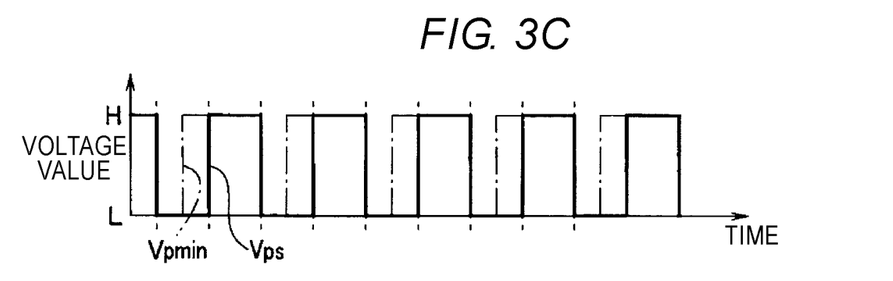
FIG. 3C is a view illustrating exemplary waveforms of a pulse modulation signal and a minimum pulse width signal of the DC-DC converter according to the first embodiment.
Figure 3D:
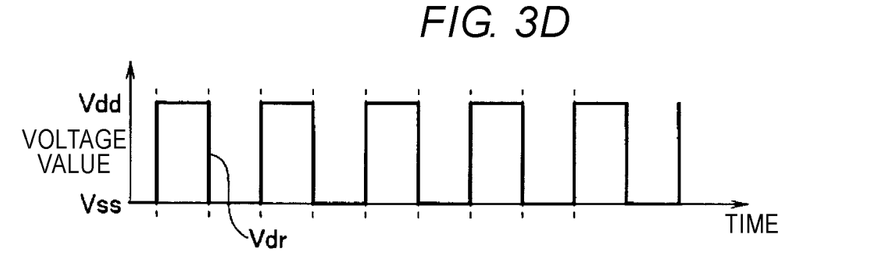
FIG. 3D is a view illustrating an exemplary waveform of a driving signal of the DC-DC converter according to the first embodiment.
Figure 3E:
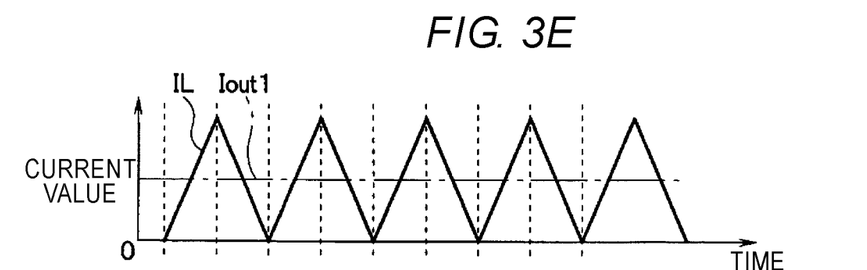
FIG. 3E is a view illustrating an exemplary waveform of an inductor current of the DC-DC converter according to the first embodiment.

FIGS. 3A to 3E are diagrams illustrating exemplary waveforms in the heavy-load operation of the DC-DC converter 1 according to the first embodiment. FIG. 3A illustrates exemplary waveforms of the reference signal Vmod and the feedback signal Vfb. FIG. 3B illustrates an exemplary waveform of the comparator signal Vcomp. FIG. 3C illustrates exemplary waveforms of the pulse modulation signal Vps and the minimum pulse width signal Vpmin. FIG. 3D illustrates an exemplary waveform of the driving signal Vdr. FIG. 3E illustrates an exemplary waveform of the inductor current IL. In FIGS. 3A to 3D, the horizontal axis represents time, and the vertical axis represents a voltage value. In FIG. 3E, the horizontal axis represents time, and the vertical axis represents a current value. In FIG. 3A, the feedback signal Vfb is schematically expressed by a straight line.

The reference signal Vmod is a triangular wave. As illustrated in FIG. 3A, when the feedback signal Vfb is less than the reference signal Vmod, the comparator signal Vcomp becomes a negative pulse of an L level (FIG. 3B).

When the comparator signal Vcomp becomes an L level, that is, as the comparator signal Vcomp drops, the pulse modulation signal Vps becomes an L level due to the AND circuit 42 (FIG. 3C).

When the pulse modulation signal Vps is at an L level, the FET 53p is turned ON. The current which flows on the source of the FET 53p is converted into the detection signal Vi in the current detection amplifier Op which is to be output to the comparator 44. When the detection signal Vi is equal to or more than the reference voltage Vref2, the comparator 44 outputs an H-level signal. Then, the multiplexer 45 outputs the minimum pulse width signal Vpmin of an H level.

The AND circuit 42 outputs the pulse modulation signal Vps of an L level based on the minimum pulse width signal Vpmin of an H level and the comparator signal Vcomp of an L level. That is, in the heavy-load operation, even though the minimum pulse width signal Vpmin increases, the pulse modulation signal Vps is maintained to be at the L level.

When the minimum pulse width signal Vpmin becomes an H level and thereafter, the comparator signal Vcomp also becomes an H level, the pulse modulation signal Vps becomes an H level. When the pulse modulation signal Vps becomes an H level, the FET 53n is turned ON, and the driving signal Vdr which is the ground voltage Vss is output to the inductor L.

As illustrated in FIG. 3D, in the heavy-load operation, the driving signal Vdr increases as the comparator signal Vcomp drops, and drops as the comparator signal Vcomp increases.

As illustrated in FIG. 3E, the inductor current IL increases when the driving signal Vdr becomes the power supply voltage Vdd, and decreases when the driving signal Vdr becomes the ground voltage Vss. When the inductor current IL is averaged, the averaged inductor current IL becomes the average output current Iout1.

Subsequently, the light-load operation of the DC-DC converter 1 will be described. In the light-load operation, an average output current Iout2 for the external load device R is set to be smaller than that of the heavy-load operation, for example, when the external load device R is in a stand-by state.

Figure 4A:
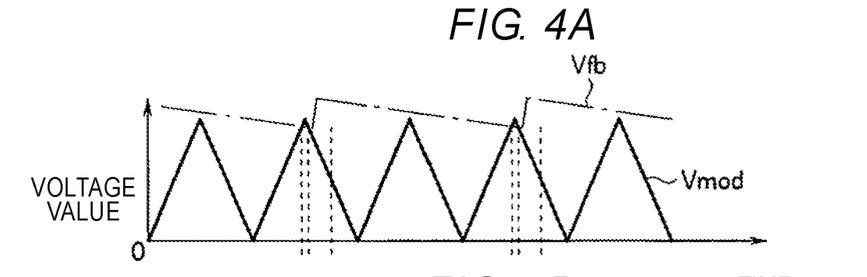
FIG. 4A is a view illustrating exemplary waveforms of a reference signal and a feedback signal of the DC-DC converter according to the first embodiment.
Figure 4B:
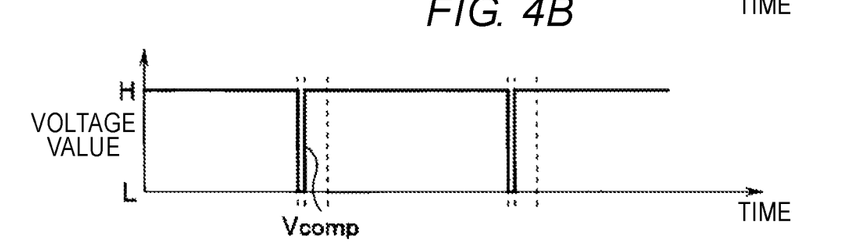
FIG. 4B is a view illustrating an exemplary waveform of a comparator signal of the DC-DC converter according to the first embodiment.
Figure 4C:
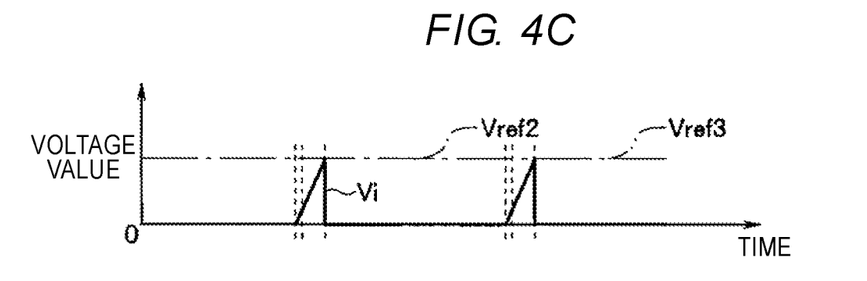
FIG. 4C is a view illustrating an exemplary waveform of the feedback signal of the DC-DC converter according to the first embodiment.
Figure 4D:
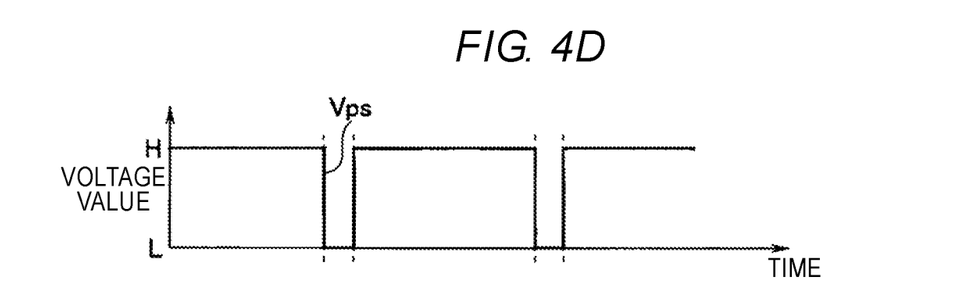
FIG. 4D is a view illustrating an exemplary waveform of the pulse modulation signal of the DC-DC converter according to the first embodiment.
Figure 4E:
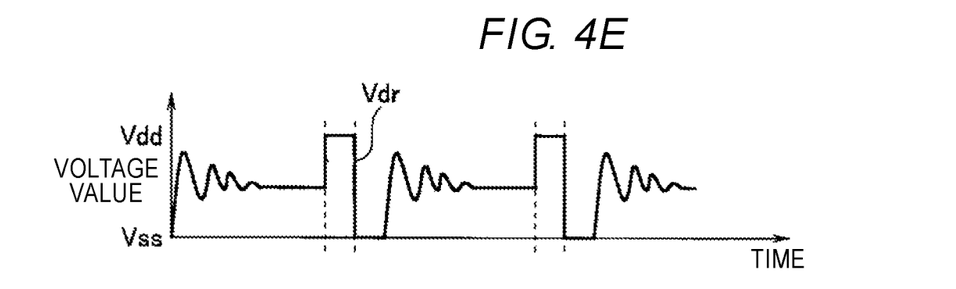
FIG. 4E is a view illustrating an exemplary waveform of the driving signal of the DC-DC converter according to the first embodiment.
Figure 4F:
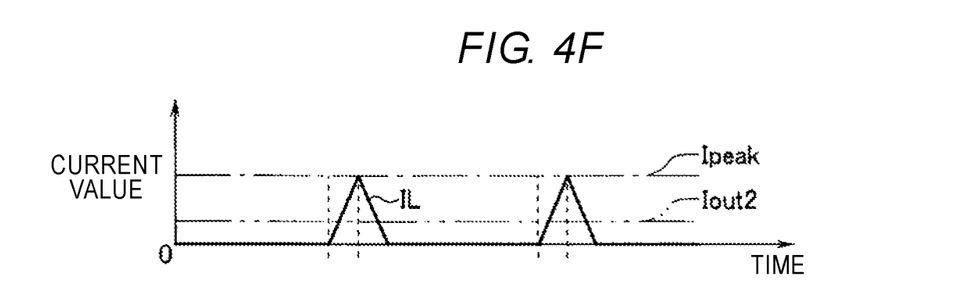
FIG. 4F is a view illustrating an exemplary waveform of the inductor current of the DC-DC converter according to the first embodiment.

FIGS. 4A to 4F are diagrams illustrating each exemplary waveform in the light-load operation of the DC-DC converter 1 according to the first embodiment. FIG. 4A illustrates exemplary waveforms of the reference signal Vmod and the feedback signal Vfb. FIG. 4B illustrates an exemplary waveform of the comparator signal Vcomp. FIG. 4C illustrates an exemplary waveform of the feedback signal Vfb. FIG. 4D illustrates an exemplary waveform of the pulse modulation signal Vps. FIG. 4E illustrates an exemplary waveform of the driving signal Vdr. FIG. 4F illustrates an exemplary waveform of the inductor current IL. In FIGS. 4A to 4E, the horizontal axis represents time, and the vertical axis represents a voltage value. In FIG. 4F, the horizontal axis represents time, and the vertical axis represents a current value.

As illustrated in FIG. 4A, in the light-load operation, the feedback signal Vfb gradually decreases as time elapses over a peak of the reference signal Vmod. When the feedback signal Vfb intersects the reference signal Vmod, the feedback signal Vfb is adjusted higher than the peak of the reference signal Vmod and then gradually decreases with time.

The comparator signal Vcomp becomes an L level while the feedback signal Vfb intersects the reference signal Vmod, that is, while the reference signal Vmod is lower than the feedback signal Vfb (FIG. 4B). In the light-load operation, after the feedback signal Vfb and the reference signal Vmod intersects each other, a time until the feedback signal Vfb and the reference signal Vmod intersects each other at a later time is longer than in the heavy-load operation, and the frequency of the comparator signal Vcomp decreases.

When the comparator signal Vcomp becomes an L level, the pulse modulation signal Vps also becomes an L level, and the FET 53p is turned ON. The current which flows on the source of the FET 53p is converted into the detection signal Vi in the current detection amplifier Op to be output to the comparator 44. Even though the comparator signal Vcomp becomes an H level from an L level, the detection signal Vi does not immediately equal to or more than the reference voltage Vref2, and the minimum pulse width signal Vpmin is at an L level. Accordingly, even though the minimum pulse width signal Vpmin becomes an L level and thereafter, the comparator signal Vcomp increases to an H level, the pulse modulation signal Vps becomes an L level, and the FET 53p is in the ON-state.

When the inductor current IL is equal to or more than the predetermined peak current Ipeak (FIG. 4F), the detection signal Vi also becomes equal to or more than the reference voltage Vref2 (FIG. 4C), and the signal from the comparator 44 becomes an H level.

When the signal from the comparator 44 becomes an H level, the minimum pulse width signal Vpmin also becomes an H level. Then, the pulse modulation signal Vps becomes an H level (FIG. 4D).

As illustrated in FIG. 4E, the driving signal Vdr transitions to the H level with the same pulse width as the L level of Vps.

As illustrated in FIG. 4F, the inductor current IL increases when the driving signal Vdr becomes the power supply voltage Vdd, and decreases when the driving signal Vdr becomes the ground voltage VSS. Further, the reverse flow of the current is interrupted by the reverse flow suppressing circuit Bp. As a result, the decrease of the inductor current IL stops at 0 [A]. In addition, the average output current Iout2 in the light-load operation is smaller than the average output current Iout1 (FIG. 3E) in the heavy-load operation.

That is, the pulse modulation signal Vps is pulse width-modulated in the heavy-load operation and includes the pulse frequency-modulated signal in the light-load operation. As a result, in the DC-DC converter 1, a switching frequency of the light-load operation is lower than the switching frequency of the heavy-load operation.

According to the first embodiment, the DC-DC converter 1 may acquire a pulse signal output depending on the output voltage Vout by comparing the reference signal Vmod and the feedback signal Vfb with each other, and in the light-load operation, the switching frequency decreases as compared with a case where the pulse width setting circuit 41 is not used. As a result, the power consumption due to the switching loss is suppressed.

(Second Embodiment)

In a second embodiment, the pulse width of the pulse modulation signal Vps is set by the current detection circuit Dc, but may also be set by a time detection circuit Dt.

Figure 5:
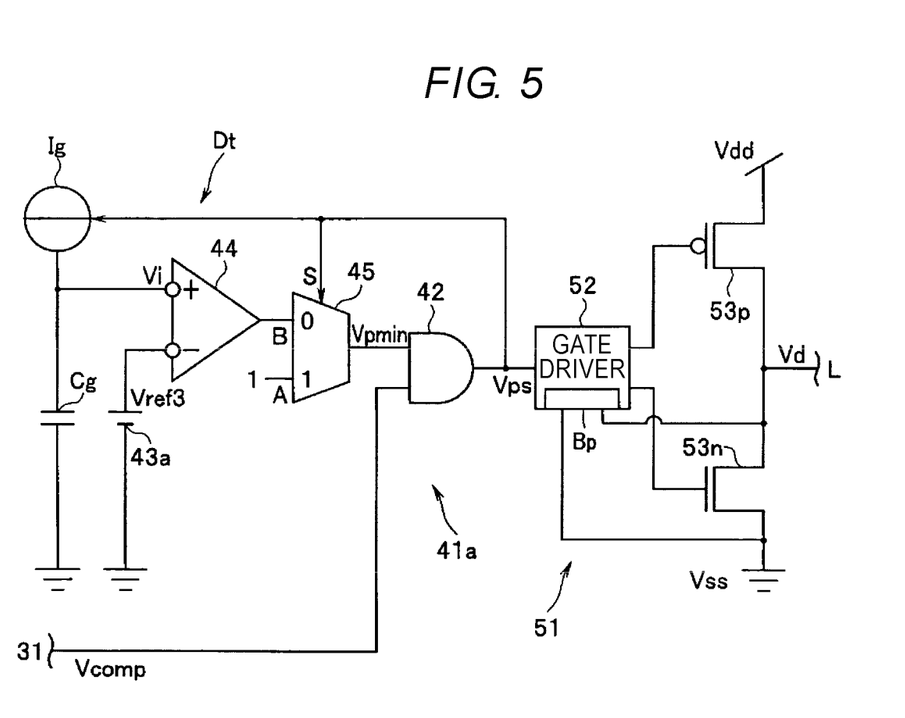
FIG. 5 is a circuit diagram illustrating an exemplary configuration of a pulse width setting circuit and a driver of a DC-DC converter according to a second embodiment.

FIG. 5 is a circuit diagram illustrating an exemplary configuration of a pulse width setting circuit 41a and a driver 51 of a DC-DC converter 1 according to a second embodiment. In describing the second embodiment, the same components as those of the first embodiment will be denoted by the same reference numerals as used in the first embodiment, and descriptions thereof will be omitted.

The pulse width setting circuit 41a includes the time detection circuit Dt that is able to detect that a predetermined time elapsed. The time detection circuit Dt includes a current source circuit Ig, a capacitor Cg, and a power supply circuit 43a.

In the current source circuit Ig, the input terminal is connected to the AND circuit 42, and the output terminal is connected to the comparator 44 and the fixed potential. The capacitor Cg for charge accumulation is provided between the current source circuit Ig and the fixed potential. When the pulse modulation signal Vps of an L level is input from the AND circuit 42, the current source circuit Ig outputs a static current to generate a ramp voltage by the capacitor Cg and inputs the detection signal Vi based on the generated ramp voltage in the comparator 44.

One end of the power supply circuit 43a is connected to the fixed potential, and the other end thereof is connected to the comparator 44. The power supply circuit 43a generates a reference voltage Vref3.

The reference voltage Vref3 is represented by Expression (2).

$$Vref3\ [V] = \text{predetermined time } [T] \times \text{output current value } [A] \text{ of current source circuit } Ig/\text{capacitance } [F] \text{ of capacitor } Cg \quad (2)$$

When the detection signal Vi is equal to or more than the reference voltage Vref3 (two point chain line of FIG. 4C), the comparator 44 outputs an H-level signal to the multiplexer 45.

That is, the pulse width setting circuit 41a generates the minimum pulse width signal Vpmin based on the detection result of the time detection circuit Dt and generates the pulse modulation signal Vps based on the minimum pulse width signal Vpmin.

Even though the pulse modulation signal Vps is generated based on the time detection circuit Dt, the pulse signal, which depends on the output voltage Vout, may be provided similarly to the DC-DC converter 1 in the first embodiment.

According to the second embodiment, the DC-DC converter 1 may set the minimum pulse width by the time detection circuit Dt and acquire the pulse signal output depending on the output voltage Vout by comparing the reference signal Vmod and the feedback signal Vfb with each other. In the light-load operation, the switching frequency decreases, as compared with the case where the pulse width setting circuit 41 is not used. As a result, the power consumption by the switching loss is suppressed.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a modulator configured to modulate a reference voltage to generate a reference signal;
   a comparator configured to generate a comparator signal based on a result of comparing the reference signal and a feedback of an output signal supplied to an output terminal;
   a pulse width setting circuit configured to generate a pulse modulation signal based on the comparator signal, pulses of the pulse modulation signal having a pulse width that is equal to or greater than a predetermined pulse width; and
   a driver configured to output a driving signal that is based on the pulse modulation signal to the output terminal through an inductor.

2. The semiconductor device according to claim 1, wherein the pulse modulation signal includes a signal which is pulse width-modulated in a heavy-load operation and is pulse frequency-modulated in a light-load operation.

3. The semiconductor device according to claim 2, wherein an average output current through the output terminal is greater for the heavy-load operation than for the light-load operation.

4. The semiconductor device according to claim 1, wherein the pulse width setting circuit is configured to generate a pulse width signal in which each pulse width is a minimum, and generate the pulse modulation signal based on the pulse width signal having the minimum pulse width.

5. The semiconductor device according to claim 4, wherein the pulse width setting circuit includes a current detection circuit configured to detect that a current which the driver outputs to the inductor is equal to or greater than a predetermined peak current, and is configured to generate the pulse width signal having the minimum pulse width based on a detection result of the current detection circuit.

6. The semiconductor device according to claim 4, wherein the pulse width setting circuit includes a time detection circuit configured to detect that a predetermined time has elapsed, and generates the pulse width signal having the minimum pulse width based on a detection result of the time detection circuit.

7. A DC-DC converter comprising:
   a modulator configured to modulate a reference voltage to generate a reference signal;
   a comparator configured to generate a comparator signal based on a result of comparing the reference signal and a feedback of an output signal that is supplied to an output terminal;
   a pulse width setting circuit configured to generate a pulse modulation signal based on the comparator signal, pulses of the pulse modulation signal having a pulse width that is equal to or greater than a predetermined pulse width;
   a driver configured to output a driving signal that is based on the pulse modulation signal; and
   an inductor connected between an output of the driver and the output terminal.

8. The DC-DC converter according to claim 7, further comprising:
   a capacitor between the output terminal and a fixed potential.

9. The DC-DC converter according to claim 8, wherein the fixed potential is ground.

10. The DC-DC converter according to claim 8, wherein the pulse modulation signal includes a signal which is pulse width-modulated in a heavy-load operation and is pulse frequency-modulated in a light-load operation.

11. The DC-DC converter according to claim 8, wherein an average output current through the output terminal is greater for the heavy-load operation than for the light-load operation.

12. The DC-DC converter according to claim 8, wherein the pulse width setting circuit is configured to generate a pulse width signal in which each pulse width is a minimum, and generate the pulse modulation signal based on the pulse width signal having the minimum pulse width.

13. The DC-DC converter according to claim 12, wherein the pulse width setting circuit includes a current detection circuit configured to detect that a current which the driver outputs to the inductor is equal to or greater than a predetermined peak current, and is configured to generate the pulse width signal having the minimum pulse width based on a detection result of the current detection circuit.

14. The DC-DC converter according to claim 12, wherein the pulse width setting circuit includes a time detection circuit configured to detect that a predetermined time has elapsed, and generates the pulse width signal having the minimum pulse width based on a detection result of the time detection circuit.

15. A DC-DC conversion method, comprising:
   modulating a reference voltage to generate a reference signal;
   comparing the reference signal and a feedback of an output signal that is supplied to an output terminal to generate a comparator signal;
   generating a pulse modulation signal based on the comparator signal, pulses of the pulse modulation signal having a pulse width that is equal to or greater than a predetermined pulse width; and
   outputting a driving signal that is based on the pulse modulation signal to the output terminal through an inductor.

16. The DC-DC conversion method according to claim 15, wherein the pulse modulation signal includes a signal which is pulse width-modulated in a heavy-load operation and is pulse frequency-modulated in a light-load operation.

17. The DC-DC conversion method according to claim 16, wherein an average output current through the output terminal is greater for the heavy-load operation than for the light-load operation.

18. The DC-DC conversion method according to claim 15, further comprising:
   generating a pulse width signal in which each pulse width is a minimum,
   wherein the pulse modulation signal is generated based on the pulse width signal having the minimum pulse width.

19. The DC-DC conversion method according to claim 18, further comprising:
   detecting that a current output to the inductor is equal to or greater than a predetermined peak current,
   wherein the pulse width signal having the minimum pulse width is generated based on said detecting.

20. The DC-DC conversion method according to claim 18, further comprising:
   detecting that a predetermined time has elapsed,
   wherein the pulse width signal having the minimum pulse width is generated based on said detecting.

* * * * *